United States Patent [19]

Bainbridge et al.

[11] Patent Number: 5,150,277
[45] Date of Patent: Sep. 22, 1992

[54] COOLING OF ELECTRONIC EQUIPMENT CABINETS

[75] Inventors: Gary D. Bainbridge, Sparta; Stephen J. Palaszewski, Chester, both of N.J.

[73] Assignee: AT&T Bell Laboratories, Murray Hill, N.J.

[21] Appl. No.: 742,210

[22] Filed: Jul. 6, 1991

Related U.S. Application Data

[63] Continuation of Ser. No. 519,050, May 4, 1990, abandoned.

[51] Int. Cl.[5] .............................................. H05K 7/20
[52] U.S. Cl. .................................. 361/384; 361/390; 361/395
[58] Field of Search .................... 165/104.33; 361/381, 361/383, 384, 390, 391, 395, 399

[56] References Cited

U.S. PATENT DOCUMENTS

| | | | |
|---|---|---|---|
| 3,317,798 | 5/1967 | Chu et al. | 361/384 |
| 3,387,648 | 6/1968 | Ward et al. | 165/104.33 |
| 3,396,780 | 8/1968 | Koltuniak et al. | 361/384 |
| 4,027,206 | 5/1977 | Lee | 361/384 |
| 4,535,386 | 8/1985 | Frey, Jr. et al. | 361/381 |
| 4,797,783 | 1/1989 | Kohmoto et al. | 361/384 |
| 4,860,163 | 8/1989 | Sarath | 361/384 |

FOREIGN PATENT DOCUMENTS

| | | |
|---|---|---|
| 18288/88 | 1/1989 | Australia . |
| 23900/88 | 4/1989 | Australia . |
| 0212871 | 8/1984 | Fed. Rep. of Germany ...... 361/384 |

OTHER PUBLICATIONS

C. Harper, Editor, "Handbook of Electronic Packaging", Ch. 11, p. 41. May 1970.
Chu et al. "IBM Technical Disclosure Bulletin, Uninterruptible Modular Air –Cooled System", vol. 15, No. 12 May 1973, pp. 3654–3655.
Fujitsu Practices, Section FJTU-320-512-100, "Fujitsu Digital Loop Carrier General Description", p. 38 (May 1988).

Primary Examiner—Gregory D. Thompson
Attorney, Agent, or Firm—L. H. Birnbaum

[57] ABSTRACT

Disclosed is an apparatus for cooling unvented cabinets housing electronic equipment. A fanning unit at a bottom portion of the cabinet draws air down through the spaces between printed circuit boards which include the electronic components. A plate installed on the inside of the cabinet door creates a duct to cause cooling of the air at the door surface as it flows upward for recirculation. A heat exchange element may also be provided in the space between the equipment mounted on both sides of the cabinet.

11 Claims, 5 Drawing Sheets

COOLING OF ELECTRONIC EQUIPMENT CABINETS

This application is a continuation of application Ser. No. 07/519,050, filed on May 4, 1990, now abandoned.

BACKGROUND OF THE INVENTION

This invention relates to cooling of electronic components.

Higher heat densities in electronic equipment caused by the increasing density of integrated circuits and circuit pack configurations, has led to concern regarding the ability of unvented outdoor electronic cabinets to dissipate the heat generated by the electronics. The equipment is usually housed in shelves within an appropriate cabinet and cooled by fans. Fans can be adapted to blow recirculated coolant onto the components through a series of ducts (see, e.g., U.S. Pat. No. 3,387,648 issued to Ward, Jr., et al). Alternatively, a fan can draw air from outside the cabinet through openings in a wall of the cabinet and direct it over the components (see, e.g., U.S. Pat. No. 4,027,206 issued to Lee). Appropriate ducts can also be used to guide the air (see, e.g., U.S. Pat. No. 4,860,163 issued to Sarath).

Such cooling techniques, while generally adequate, are not necessarily effective in cases where a large number of high density circuit packs must be housed within a fairly small space, as in the case of subscriber loop carrier (SLC ®) remote terminal channel banks. Such banks typically include channel units and common units which are each capable of generating up to 10 watts of heat. These circuit packs are mounted vertically with, typically, 28 circuit packs per shelf and 5 shelves per bank. Usually, banks are housed back-to-back in a cabinet with a small space between them.

The present method generally employed to cool unvented cabinets, which is to blow air into the banks, has reached the limit of its effectiveness. Attempts to increase cooling have generally involved use of heat pipes or finned heat exchangers without addressing the optimization of airflow within the cabinet.

It is, therefore, the objective of the invention to provide a means for enhanced cooling of electronic components mounted within an unvented cabinet by increasing internal airflow over cabinet surfaces exposed to outside air and increasing the flow of cooled internal air through the electronic equipment.

SUMMARY OF THE INVENTION

This and other objects are achieved in accordance with the invention which, in one aspect, is a cabinet for housing electronic equipment and including means for cooling said equipment. The cooling means comprises a fan mounted so as to be capable of drawing air down through said equipment, and means for providing recirculation of the air. The recirculation means includes a plate member mounted to a door of the cabinet so as to form a duct for the recirculation of the air adjacent to a surface of the door.

In accordance with another aspect of the invention, the recirculation means includes a heat exchanging element mounted in a spaced relationship to the equipment so that air which is recirculated in said space can be cooled by the heat exchanger. The heat exchanger element includes means for drawing air from outside the cabinet through a plurality of compartments so as to provide a cooling surface for the recirculated air in the space adjacent to said surface.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
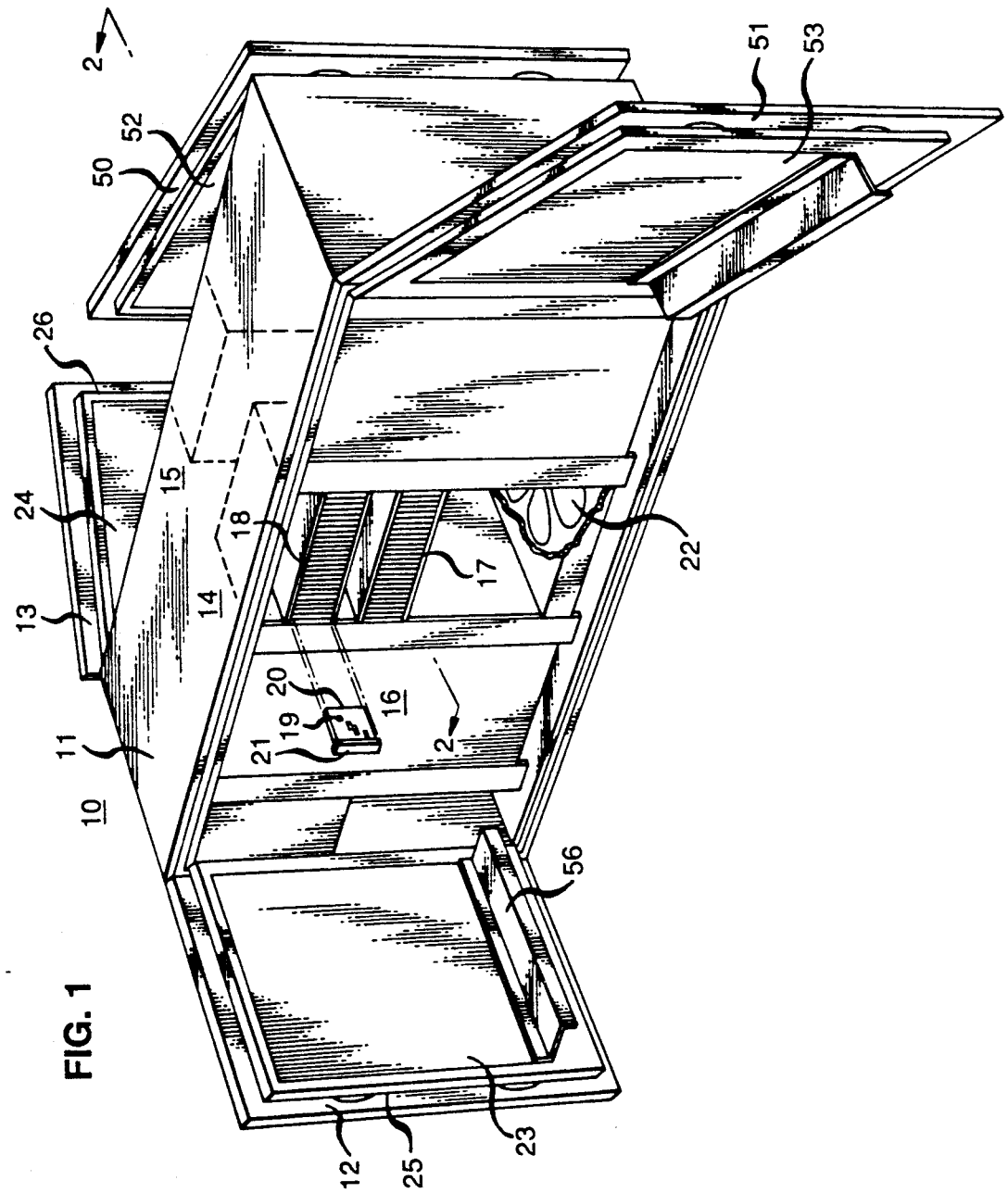
FIG. 1 is a perspective view of a cabinet including cooling means in accordance with an embodiment of the invention.

FIG. 1 illustrates an embodiment of the invention. The cabinet 10 includes a housing 11 and four doors 12, 13, 50 and 51 hinged on opposite surfaces of the housing. The electronic equipment protected by the housing includes banks 14 and 15 of circuit packs, e.g., 16, mounted in shelves, e.g., 17 and 18. Although not shown, multiple banks can be mounted in a cabinet position, e.g., one above the other. The front of the circuit packs of the two banks 14 and 15 face in opposite directions so as to be accessible by opening different doors. The circuit packs are of a standard type which include components, e.g., 19, formed on a circuit board 20 with a faceplate 21 at the front end for latching the board into the shelf. It will be appreciated that the full number of shelves, as well as other standard components on a remote terminal cabinet, such as protector blocks, power components, and wiring, have been omitted for the sake of clarity in the illustration.

At the bottom of each mounting position in the cabinet is a shelf including a fan (22 and 27 of FIG. 2) mounted so as to draw air down through the spaces between the circuit packs in the bank. The applicants discovered that drawing the air through the bank was more effective than blowing air into the bank in terms of exchanging heat between the air and the heat generating components.

Plates 23, 24, 52 and 53 are mounted in a spaced relationship with each door, 12, 13, 50 and 51, respectively, to provide ducts, e.g., 25 and 26 of doors 12 and 13, for recirculating air as described in more detail below. In this particular example, each plate covered essentially the entire inside surface of its respective door and was mounted to the door by screws and standoffs, but any standard mounting arrangement can be employed. The plates were made of aluminum, but other materials can also be used. The ducts formed between the plates and the doors were approximately 3 cm wide. Each plate also included a horizontal baffle, e.g., 56, mounted to a bottom portion of the plate by standard means.

Figure 2:
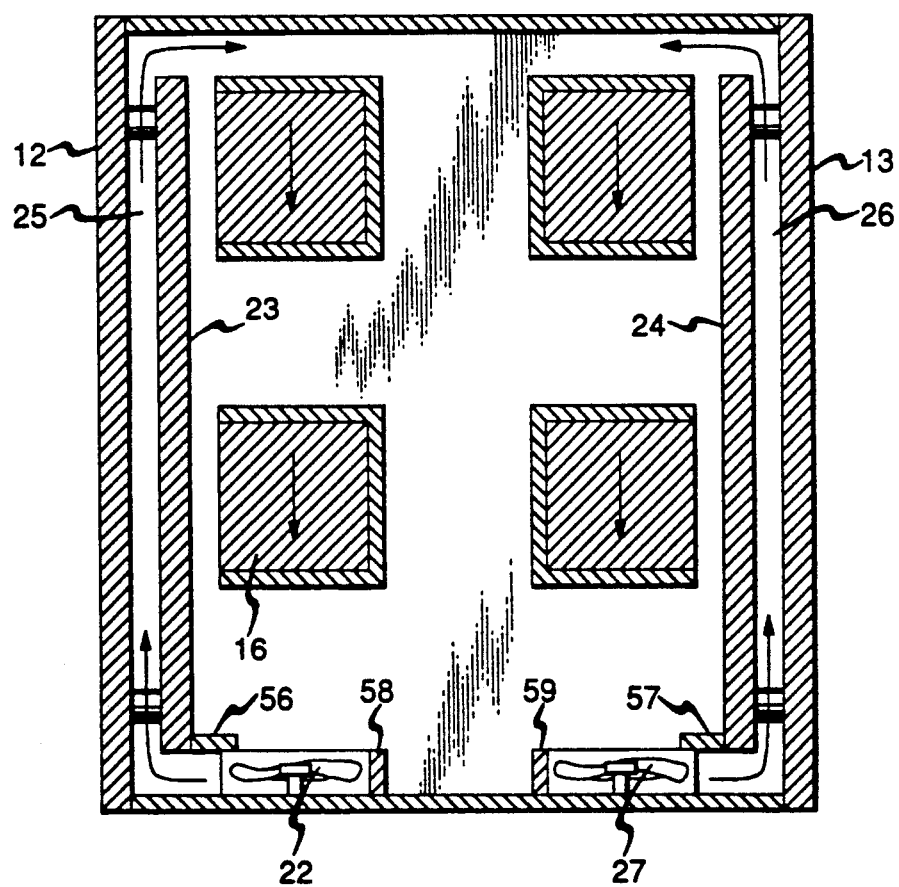
FIG. 2 is a cross-sectional schematic view of the cabinet of FIG. 1 taken along line 2—2.

FIG. 2 is a schematic cross-sectional view along line 2—2 of FIG. 1, with the doors in a closed position, illustrating the flow of air through the cabinet when the fans are turned on. Each rectangular block, e.g., 16, represents a channel bank (typically 5 shelves of circuit packs). As previously mentioned, the fans 22 and 27 draw air down through the banks of circuit packs as indicated by the arrows. The air is then recirculated through the ducts 25 and 26 formed between the plates 23 and 24 and the doors 12 and 13. The ducts prevent the recirculating air from entering the spaces between the faceplates of the circuit packs since the plates extend essentially the entire vertical distance occupied by the circuit packs. While the recirculating air traverses the ducts 25 and 26 it is cooled by the inside surface of the doors 12 and 13 which are made of a good heat conducting material such as aluminum. Thus, by the time the air reaches the top of the cabinet, it is cooled sufficiently so that it can again cool the circuit pack components as it is drawn down through the banks. Air circulation in the vertical space between banks is impeded by use of vertical baffles 58 and 59 attached to the shelves including fans 22 and 27.

Utilizing this technique, it was discovered that the rise in temperature of the hottest circuit packs was lowered by approximately 40 percent over prior schemes which forced air into the channel banks without using a door duct.

Figure 3:
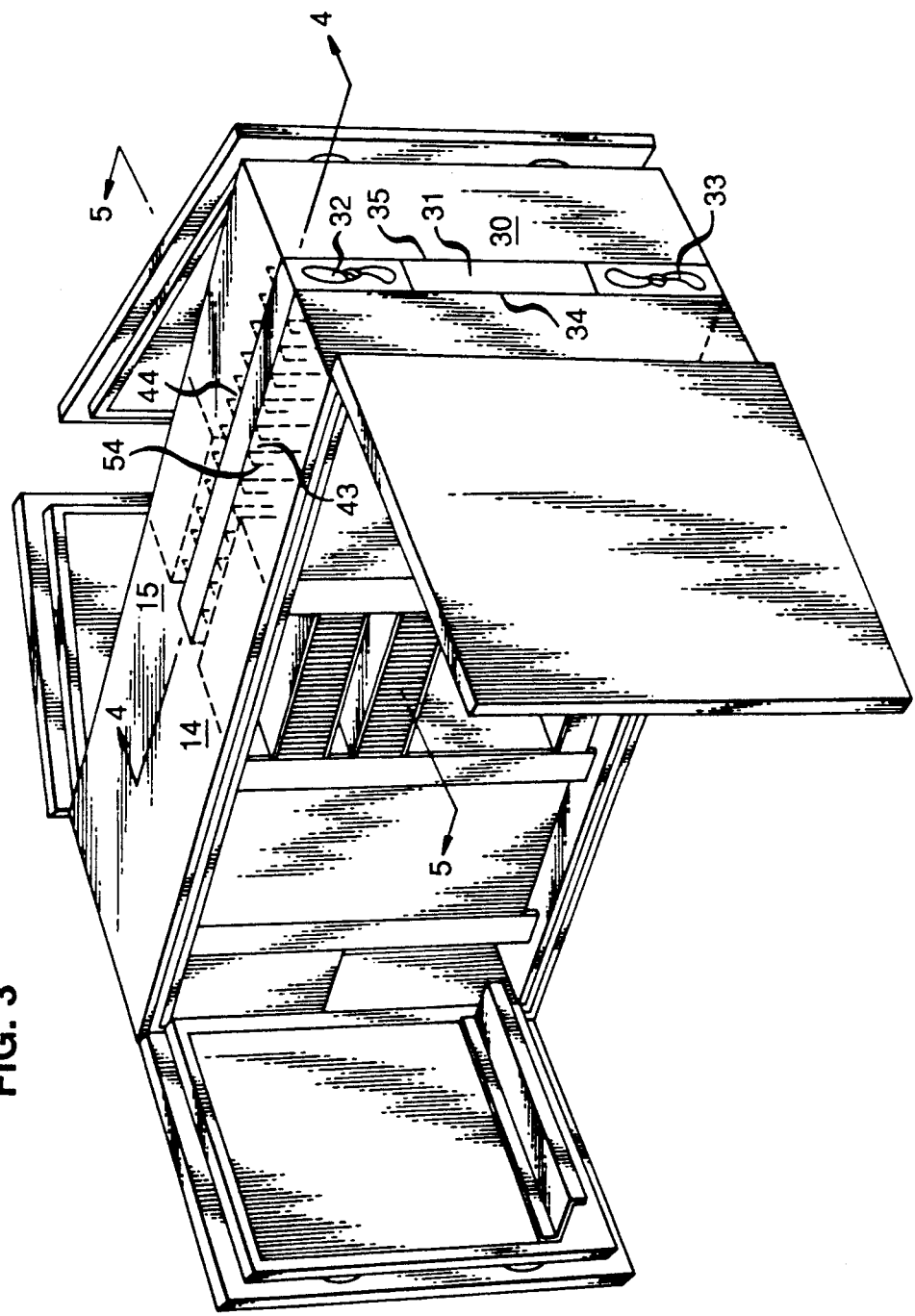
FIG. 3 is a perspective view of a cabinet including cooling means in accordance with a further embodiment of the invention.

FIG. 3 illustrates a cabinet which further enhances cooling capabilities. The cabinet is essentially the same as that illustrated in FIG. 1 except for the addition of a heat exchange element 30. This element is inserted in a side surface of the housing and extends into the spaces between the banks 14 and 15. This element includes a metal housing 31 providing heat exchanging surfaces adjacent to each bank, and means such as fans 32 and 33 for bringing in air from the outside environment and exhausting the air back to the outside environment. The housing can include metal fins, e.g., 54, for increased heat exchange.

Figure 4:
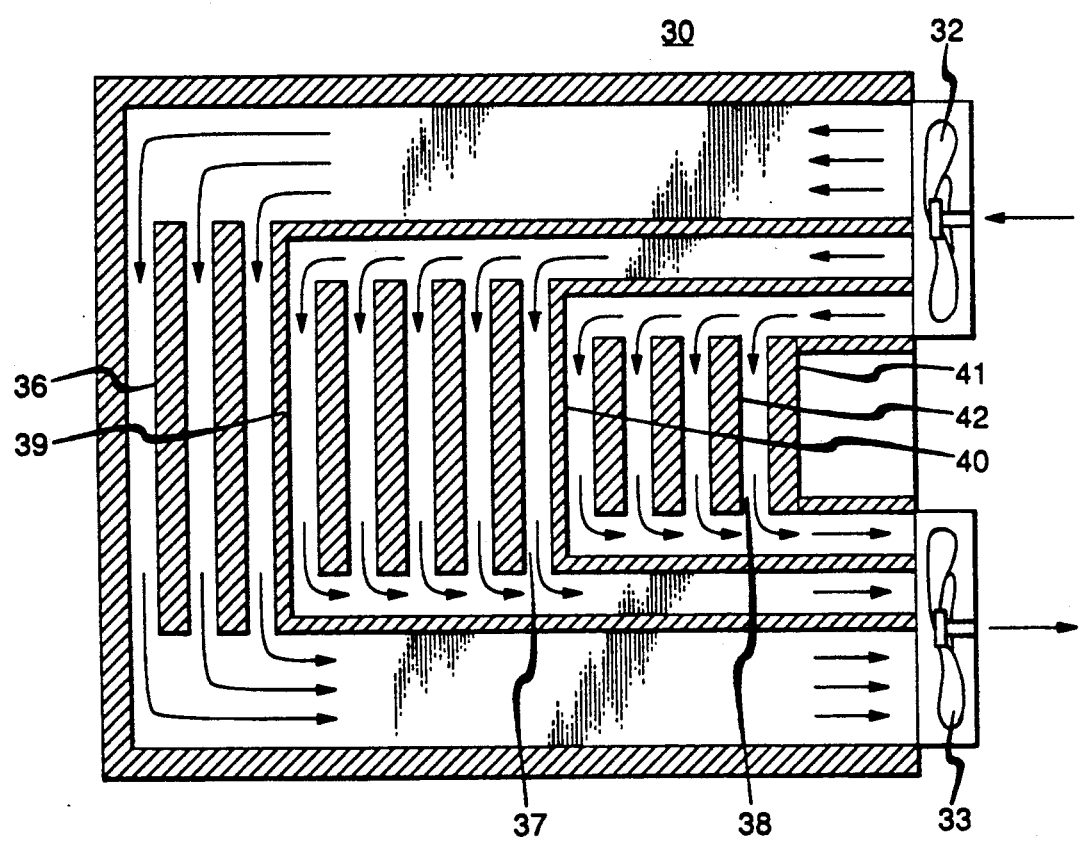
FIG. 4 is a cross-sectional schematic view of a portion of the cooling means of FIG. 3 taken along line 4—4.

As illustrated by the arrows in the cross-sectional view of the element in FIG. 4, air brought in by fan 32 is circulated through three different main compartments 36-38 formed by U-shaped baffles 39, 40 and 41 as well as secondary compartments formed by vertical plates, e.g., 42. The air is then exhausted through fan 33.

Figure 5:
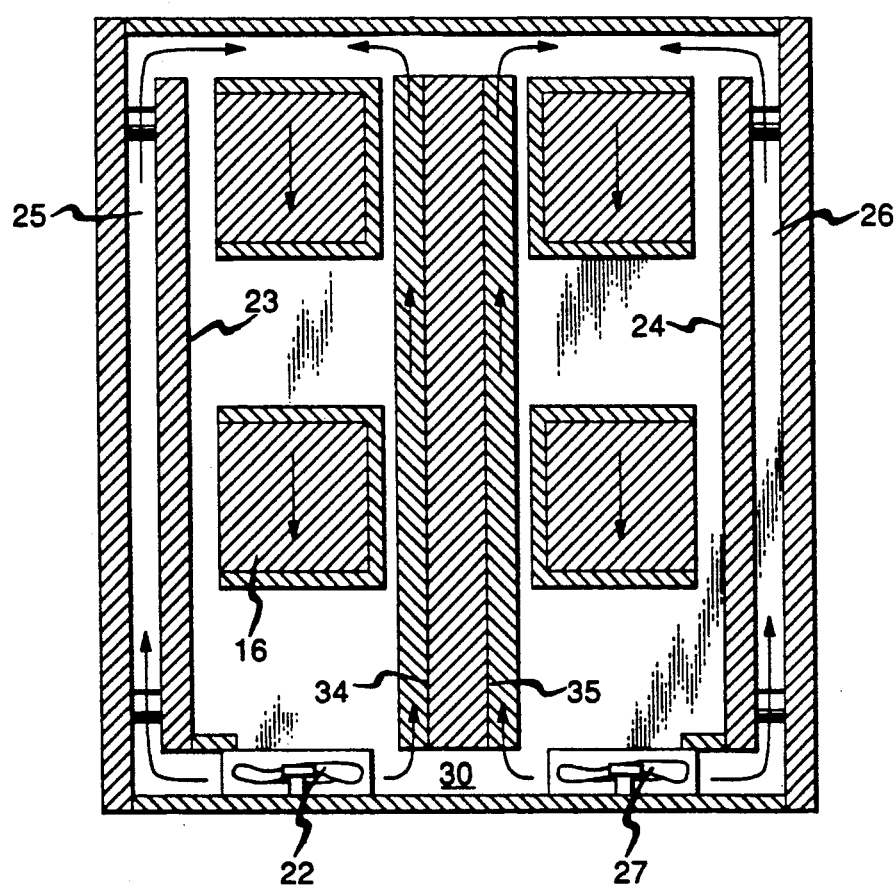
FIG. 5 is a cross-sectional schematic view of the cabinet of FIG. 3 taken along line 5—5.

This air flow produces finned heat exchange surfaces 34 and 35 which are utilized for cooling the cabinet as shown in FIG. 5, which is a cross-sectional view along line 5—5 of FIG. 3. Again, air is drawn vertically through the spaces between circuit packs in the banks by the fans 22 and 27. In addition to recirculating through ducts 25 and 26 part of the air is also recirculated in the spaces (43 and 44 of FIG. 3) between the banks which contain finned surfaces 34 and 35 of the heat exchanger element 30. In this example, the spaces 43 and 44 are approximately 3 cm wide. The recirculating air is cooled by the heat exchange surface, 34 and 35 as it traverses upward. (The air is prevented from entering the spaces between circuit packs in its upward path by the usual backplane provided for electrically interconnecting the circuit packs). The cooled air can then be drawn downward again to cool the circuit packs.

Thus, the embodiment shown in FIGS. 3-5 should permit additional heat exchange capabilities over the embodiment of FIGS. 1-2.

Various additional modifications will become apparent to those skilled in the art. All such variations which basically rely on the teachings through which the invention has advanced the art are properly considered within the scope of the invention.

We claim:

1. A cabinet (10), comprising:
a fan (22) mounted to said cabinet so as to be capable of drawing air in a vertical direction;
means for providing recirculation of the air in a vertical direction opposite to the direction of air drawn by the fan, said means including a plate member (23) mounted to the inside of a door of said cabinet to form a duct (25) for recirculation of the air adjacent to a surface of said door so as to provide cooling of the air by said surface of the door, the fan being mounted to be capable of blowing air into the duct;
a plurality of shelves (17, 18) mounted to said cabinet with a side positioned adjacent to said plate member and vertically spaced from said fan; and
a heat exchanging element (30) mounted to said cabinet and positioned adjacent to a side of said shelves opposite to said door.

2. The cabinet according to claim 1 further comprising electronic equipment which includes a plurality of circuit packs (16) positioned in said shelves (17, 18) mounted to said cabinet so that the air is drawn in vertical spaces between the circuit packs.

3. The cabinet according to claim 2 wherein the electronic equipment includes a plurality of banks (14 and 15) of circuit packs and a plurality of doors for providing access to the banks, each of said doors (12, 13, 50 and 51) including a plate element (23, 24, 52 and 53) mounted to an inside surface.

4. The cabinet according to claim 1 wherein the plate member extends a vertical distance essentially co-extensive with said plurality of shelves.

5. The cabinet according to claim 3 wherein the heat exchanging element (30) mounted to said cabinet is positioned in a space between two banks (14 and 15) so that the banks are between the element and the doors.

6. The cabinet according to claim 1 further comprising 58 a baffle mounted at a bottom portion of the plate member (23).

7. The cabinet according to claim 1 further comprising a second plurality of shelves with a side adjacent to another plate member (24) mounted to another door (13) of the cabinet, the heat exchanging element being mounted in a space between the two pluralities of shelves.

8. A cabinet (10), comprising:
a fan (22) mounted to said cabinet so as to be capable of drawing air in a vertical direction;
means mounted to said cabinet for directing the air in an opposite vertical direction;
a plurality of vertically stacked shelves (e.g., 17 and 18) mounted to the cabinet with one side positioned adjacent to a door for providing access to said shelves; and
a heat exchanging element (30) mounted to said cabinet and positioned adjacent a side of the shelves opposite to the door in a relationship to the fan so that air which is directed in the opposite vertical direction can be cooled by the heat exchanging element, said heat exchanging element comprising means (32) for drawing air from outside the cabinet through a plurality of compartments (36, 37, 38) in said element so as to provide a cooling surface (34) for the air in a space adjacent to said surface.

9. The cabinet according to claim 8 further comprising a plurality of banks (14, 15) of circuit packs (16), positioned within said shelves mounted to said cabinet with the heat exchanging element positioned in a space between the banks.

10. The cabinet according to claim 8 wherein the means for drawing air from outside the cabinet comprises a first fan (32) mounted to said element at an input portion of the compartments, and further comprising an exhaust fan (33) mounted to said element at an output portion of the compartments.

11. The cabinet according to claim 8 wherein the compartments are defined by U-shaped baffles (39, 40, 41,) and vertical plates (42) mounted to said element.

* * * * *

UNITED STATES PATENT AND TRADEMARK OFFICE
CERTIFICATE OF CORRECTION

PATENT NO. : 5,150,277

DATED : September 22, 1992

INVENTOR(S) : Gary D. Bainbridge, Stephen J. Palaszewski and Attila Sipos

It is certified that error appears in the above-identified patent and that said Letters Patent is hereby corrected as shown below:

On the title page, item [75] add as an inventor

--Attila Sipos--

Signed and Sealed this

Thirtieth Day of November, 1993

Attest:

BRUCE LEHMAN

*Attesting Officer*      *Commissioner of Patents and Trademarks*